(12) United States Patent
Selcuk

(10) Patent No.: US 6,200,864 B1
(45) Date of Patent: Mar. 13, 2001

(54) METHOD OF ASYMMETRICALLY DOPING A REGION BENEATH A GATE

(75) Inventor: Asim Selcuk, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/338,514

(22) Filed: Jun. 23, 1999

(51) Int. Cl.⁷ .................................................. H01L 21/336
(52) U.S. Cl. .......................... 438/286; 438/303; 438/305; 438/307
(58) Field of Search ..................................... 438/286, 197, 438/299, 301, 303, 305, 306, 307

(56) References Cited

U.S. PATENT DOCUMENTS

| 5,183,771 | * | 2/1993 | Mitsui et al. . | |
| 5,286,664 | | 2/1994 | Horiuchi . | |
| 5,547,885 | * | 8/1996 | Ogoh . | |
| 5,578,509 | * | 11/1996 | Fujita . | |
| 5,607,869 | * | 3/1997 | Yamazaki . | |
| 5,656,518 | * | 8/1997 | Gardner | 438/286 |
| 5,714,413 | * | 2/1998 | Brigham et al. | 438/301 |
| 5,789,787 | | 8/1998 | Kadosh et al. . | |
| 5,936,277 | * | 8/1999 | Takeuchi | 257/336 |

* cited by examiner

Primary Examiner—Long Pham

(57) ABSTRACT

A method of asymmetrically doping a region beneath a gate by controlling the lateral surface profile of the gate using a mask. A first embodiment of the method includes forming a mask over the gate such that it extends beyond the opposing sides of the gate in an uneven manner. A second embodiment of the method includes forming a mask including sidewall spacers on both sides of the gate in an uneven manner. The uneven manner of providing the mask for ion implantation can be used to define an asymmetric lateral channel profile, which can be advantageously used to vary gate overlap, channel $V_T$, or source/drain doping as necessary.

18 Claims, 7 Drawing Sheets

METHOD OF ASYMMETRICALLY DOPING A REGION BENEATH A GATE

FIELD OF THE INVENTION

The present invention relates to high-denisity semiconductor devices, and in particular, to a method of asymmetrically doping a region beneath a gate by controlling the lateral surface doping profile of the gate.

BACKGROUND OF THE INVENTION

An insulated-gate field-effect transistor (IGFET), such as a metal-oxide semiconductor field-effect transistor (MOSFET), uses a gate to control an underlying surface channel joining a source and a drain. The channel, source, and drain are located in a semiconductor substrate, with the source and drain being doped oppositely to the substrate. The gate is separated from the semiconductor substrate by a thin insulating layer such as a gate oxide layer. The operation of the IGFET involves application of an input voltage to the gate, which sets up a transverse electric field in the channel in order to modulate the longitudinal conductance of the channel.

In typical IGFET processing, the source and drain are formed by introducing dopants of second conductivity type (P or N) into a semiconductor substrate of first conductivity type (N or P) using a patterned gate as a mask. This self-aligning procedure tends to improve packaging density and reduce parasitic overlap capacitance between the gate and the source and drain.

Polysilicon (also called polycrystalline silicon, poly-Si or poly) thin films have many important uses in IGFET technology. One of the key innovations is the use of heavily doped polysilicon in place of aluminum as the gate. Since polysilicon has the same high melting point as a silicon substrate, typically a blanket polysilicon layer is deposited prior to source and drain formation, and the polysilicon is anisotropically etched to produce a gate that provides a mask during formation of the source and drain by ion implantation. Thereafter, a drive-in step is applied to repair crystalline damage and to drive-in and activate the implanted dopant.

As IGFET dimensions are reduced and the supply voltage remains constant, the electric field in the channel near the drain tends to increase. If the electric field becomes strong enough, it can give rise to so-called hot-carrier effects. For instance, hot electrons can overcome the potential energy barrier between the substrate and the gate insulator thereby causing hot carriers to become injected into the gate insulator. Trapped charge in the gate insulator due to injected hot carriers accumulates over time and can lead to a permanent change in the threshold voltage, leakage current, breakdown voltage, and drive current of the device.

A number of techniques have been utilized to reduce hot carrier effects. One such technique is a lightly doped drain (LDD). The LDD reduces hot carrier effects by reducing the maximum lateral electric field. The drain is typically formed by two ion implants. A light implant is self-aligned to the gate, and a heavy implant is self-aligned to the gate after sidewall spacers have been formed thereon. The spacers are typically oxides or nitrides. The purpose of the lighter first dose is to form a lightly doped region of the drain (or LDD) at the edge near the channel. The second heavier dose forms a low resistivity heavily doped region of the drain, which is subsequently merged with the lightly doped region. Since the heavily doped region is farther away from the channel than a conventional drain structure, the depth of the heavily doped region can be made somewhat greater without adversely affecting the device characteristics. The lightly doped region is not necessary for the source (unless bidirectional current is used), however lightly doped regions are typically formed for both the source and the drain to avoid additional processing steps.

Disadvantages of LDDs include increased fabrication complexity and increased parasitic resistance due to their light doping levels. During operation, LDD parasitic resistance decreases drain current. Linear drain current (i.e., drain current in the linear or triode region) is reduced by the parasitic resistance in both the source and the drain. Saturation drain current (i.e., drain current in the saturation region) is largely unaffected by the parasitic resistance of the drain but greatly reduced by the parasitic resistance of the source. Therefore, saturation drain current can be improved while reducing hot carrier effects by providing a lightly doped region only on the drain side. That is, the drain includes lightly and heavily doped regions, and the entire source is heavily doped.

Asymmetrical IGFETs (with asymmetrically doped sources and drains) are known in the art. For instance, U.S. Pat. No. 5,286,664 entitled "Method For Fabricating The LDD-MOSFET" by Horiuchi describes forining a gate, implanting lightly doped source and drain regions using the gate as an implant mask, forming a photoresist layer that covers the source side and exposes the drain side, depositing a single spacer on the drain side using liquid phase deposition (LPD) of silicon dioxide, stripping the photoresist, and implanting heavily doped source and drain regions using the gate and single spacer as an implant mask.

A drawback to these and other conventional asymmetrical IGFETs is that the heavily doped source and drain regions typically have identical dopant concentrations. Although the doping concentration of the heavily doped drain region may be constrained in order to reduce hot carrier effects, the doping concentration of the heavily doped source region need not be constrained in this manner. Furthermore, increasing the doping concentration of the heavily doped source region reduces the source-drain series resistance, thereby improving drive current. U.S. Pat. No. 5,789,787, entitled "Asymmetrical N-Channel And P-Channel Devices" describes a method directed at overcoming some of these disadvantages, and is relatively complex in operation.

Accordingly, a need exists for an improved method of producing an asymmetrical doping profile without the drawbacks described above.

SUMMARY OF THE INVENTION

The present invention advantageously provides a method of asymmetrically doping a region beneath a gate. The present invention achieves this result by controlling the lateral surface profile of the gate using a mask.

The present invention advantageously provides a first embodiment of a method of asymmetrically doping a region beneath a gate that includes forming a mask over the gate such that it extends beyond the opposing sides of the gate in an uneven manner. The present invention relies upon lateral diffusion during the implantation of a well to modulate the doping profile of the channel region. By modifying the positioning of the mask above the gate (i.e., the amount the mask extends beyond the opposing side of the gate), it is possible to define an asymmetric lateral channel profile, which can be advantageously used to vary gate overlap, channel $V_T$, or source/drain doping as necessary. The ion implantation produces well regions on both sides of the gate that overlap within the channel region directly beneath the gate. The uneven manner in which the mask is positioned above the gate results in more dopant being present on a side of the channel region that has less mask extending beyond that side of the gate, than dopant on an opposing side of the channel region.

The present invention advantageously provides a second embodiment of a method of asymmetrically doping a region beneath a gate that includes forming sidewall spacers on both sides of the gate in an uneven manner. An exemplary embodiment includes the formation of two sidewall spacers on a side of the gate and a single sidewall spacer on an opposing side of the gate, where the two spacers extend a distance from the gate that is greater than a distance the single spacer extends from the gate. A second exemplary embodiment includes the formation of a single sidewall spacer on both sides of the gate, where the spacers extend from the gate by unequal distances. The second embodiment uses sidewall spacers formed on both sides of the gate in an uneven manner to define an asymmetric lateral channel profile, which can be advantageously used to vary gate overlap, channel $V_T$, or source/drain doping as necessary. The uneven manner of providing spacers on both sides of the gate results in more dopant being present on a side of the channel region that has less adjacent substrate covered by sidewall spacers than on an opposing side of the channel region.

Additionally, the present invention advantageously provide a gate structure including a gate oxide layer formed on the substrate, and a polysilicon layer formed on the gate oxide layer, wherein the gate includes a pair of spacers positioned adjacent opposing sides of the gate and an outer spacer positioned adjacent one of the pair of spacers.

Additional advantages and other features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

DETAILED DESCRIPTION OF THE INVENTION

The present invention advantageously provides a method of asymmetrically doping a region beneath a gate. The present invention achieves this result by controlling the lateral surface profile of the gate using a mask.

Figure 1A:
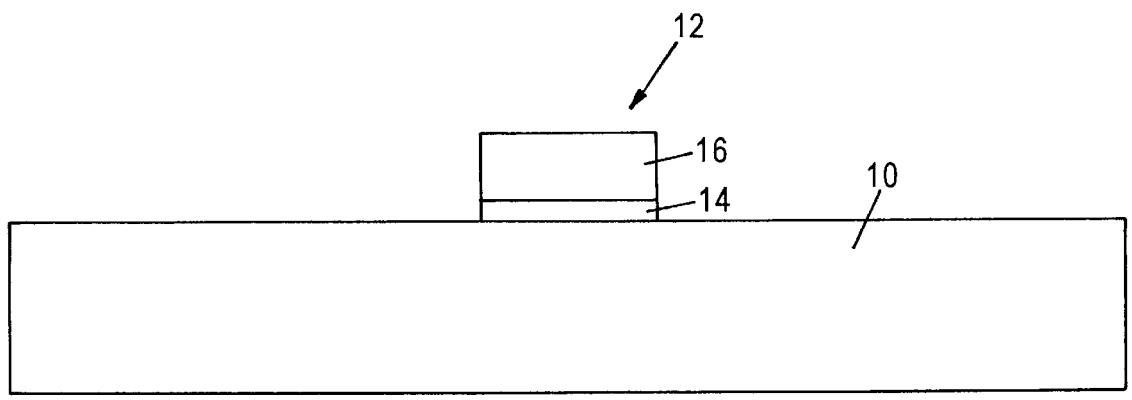
FIG. 1A is a partial, cross-sectional, side view of a semiconductor device according to a first embodiment of the present invention depicting a gate formed on a substrate.
Figure 1B:
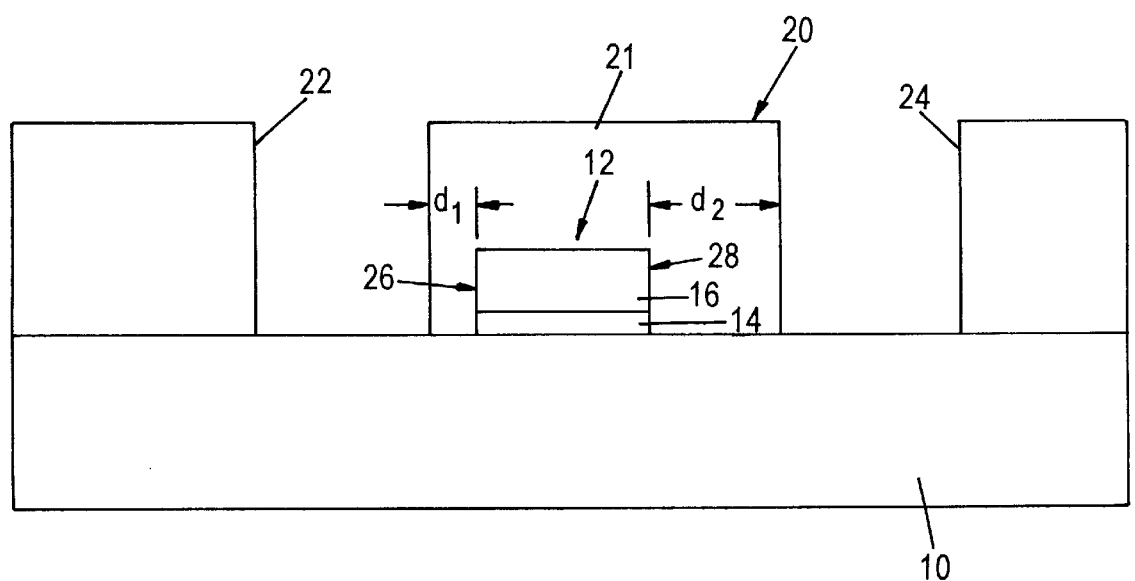
FIG. 1B is a partial, cross-sectional, side view of a semiconductor device according to the first embodiment of the present invention depicting a mask asymmetrically aligned above the gate and the substrate.
Figure 1C:
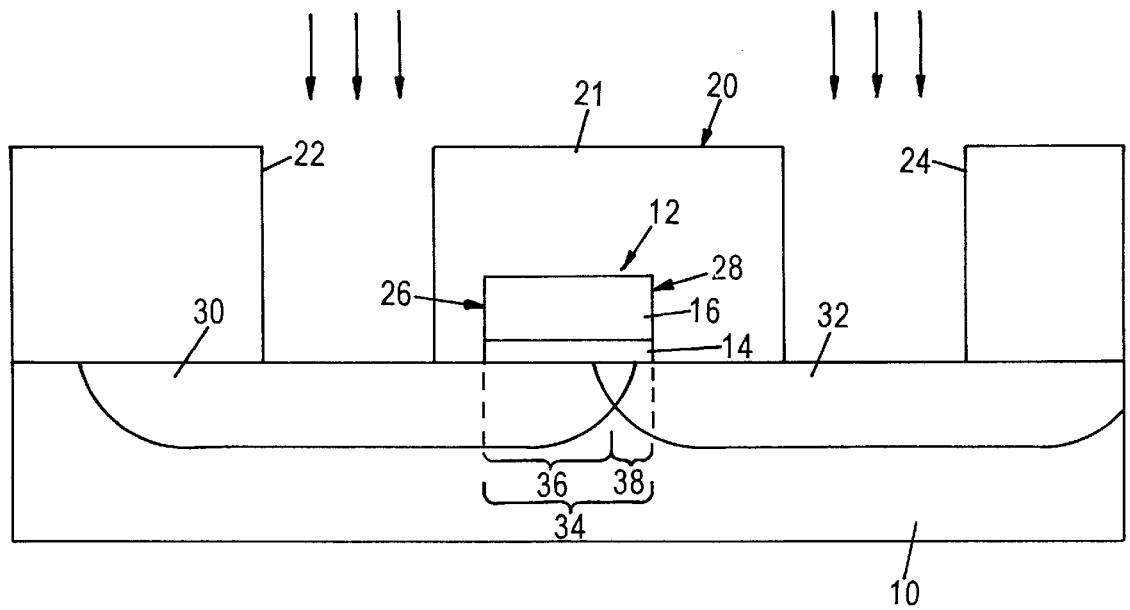
FIG. 1C is a partial, cross-sectional, side view of a semiconductor device according to the first embodiment of the present invention depicting an ion implantation on the substrate in accordance with the mask to asymmetrically dope a region beneath the gate.

FIGS. 1A–1C depict a semiconductor device of a first embodiment of the present invention at various stages along the manufacturing process. FIG. 1A is a cross-sectional view of a semiconductor device according to a first embodiment of the present invention depicting a gate 12 formed on a semiconductor substrate 10. The substrate 10 is preferably made of silicon. The gate 12 is formed on the substrate 10 and includes a gate oxide layer 14 deposited on a top surface of the substrate 10 and a polysilicon layer 16 deposited on a top surface of the gate oxide layer 14. The sides of the gate oxide layer 14 and the polysilicon layer 16 are then etched using a conventional etching process, for example an anisotropic etching process.

FIG. 1B depicts the semiconductor device of FIG. 1A after a mask 20 has been formed over the gate 12. The mask 20 is positioned over the gate 12 such that it extends beyond the opposing sides 26 and 28 of the gate 12 in an uneven manner. The mask 20 includes a pair of open regions 22 and 24 that are unevenly spaced from the opposing sides 26 and 28 of the gate 12. Specifically, the open region 22 is spaced a distance $d_1$ from side 26 of the gate 12 and open region 24 is spaced a distance $d_2$ from side 28 of the gate 12. Alternatively, the mask 20 can be fonned such that it only includes portion 21 and therefore the mask extends beyond side 26 by a distance of $d_1$ and side 28 by a distance of $d_2$. The present invention contemplates that distance $d_1$ and $d_2$ are predetermined distances that are not equal to one another. Therefore, the present invention contemplates either that distance $d_1$ is less than $d_2$, as depicted in FIG. 1B, or that distance $d_1$ is greater than $d_2$, which is not depicted in the Figures, but which can be easily manufactured by one of skill in the art based upon the description set forth herein. The gate 12 and mask 20 may be formed using any suitable processing method.

FIG. 1C depicts the semiconductor device according to the first embodiment of the present invention wherein an ion implantation is performed on the substrate 10 in accordance with the mask 20 to asymmetrically dope a region 34 beneath the gate 12.

The present invention relies upon lateral diffusion during the implantation of a well to modulate the doping profile of the channel region 34. By modifying the positioning of the mask 20 above the gate 12 (i.e., the magnitude of $d_1$ and $d_2$), it is possible to define an asymmetric lateral channel profile, which can be advantageously used to vary gate overlap, channel $V_T$, or source/drain doping as necessary. The ion implantation of the semiconductor device in FIG. 1C proceeds through open regions 22 and 24 to produce well regions 30 and 32, respectively, in the substrate 10. The well regions 30 and 32 are formed directly beneath their respective open regions 22 and 24 and are diffused outward therefrom. The well regions 30 and 32 depicted in FIG. 1C overlap within the channel region 34 beneath the gate 12, such that there is more dopant on a side 36 of the channel region 34, than dopant on an opposing side 38.

Figure 2:
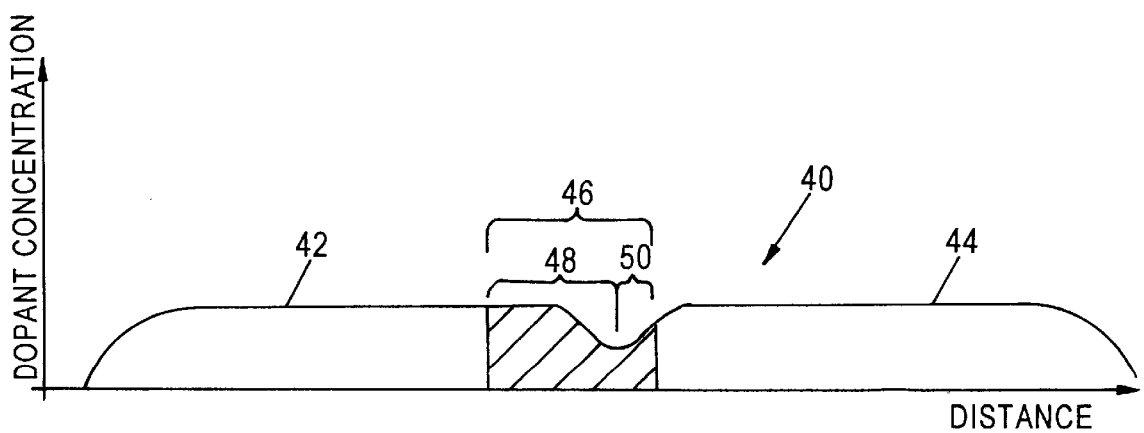
FIG. 2 is a graph depicting an asymmetric doping profile for the semiconductor device according to the first embodiment of the present invention.

FIG. 2 is a graph depicting an asymmetric doping profile 40 for the semiconductor device according to the first embodiment of the present invention. FIG. 2 depicts the doping profile 40 over the length of the semiconductor device depicted in FIG. 1C. Portions 42 and 44 reflect the doping in well regions 30 and 32. In FIG. 2, region 46 corresponds to channel region 34 and regions 48 and 50 correspond to side regions 36 and 38. Note the asymmetric doping profile 40 is larger in region 48 than in region 50. Region 48 is larger because it corresponds to the side 36 of the channel region 34 with the opening region 22 closer to the side 26 of the gate 12. By varying $d_1$ and $d_2$, the size of region 48 and region 50 can be varied to produce any necessary doping profile.

Figure 3:
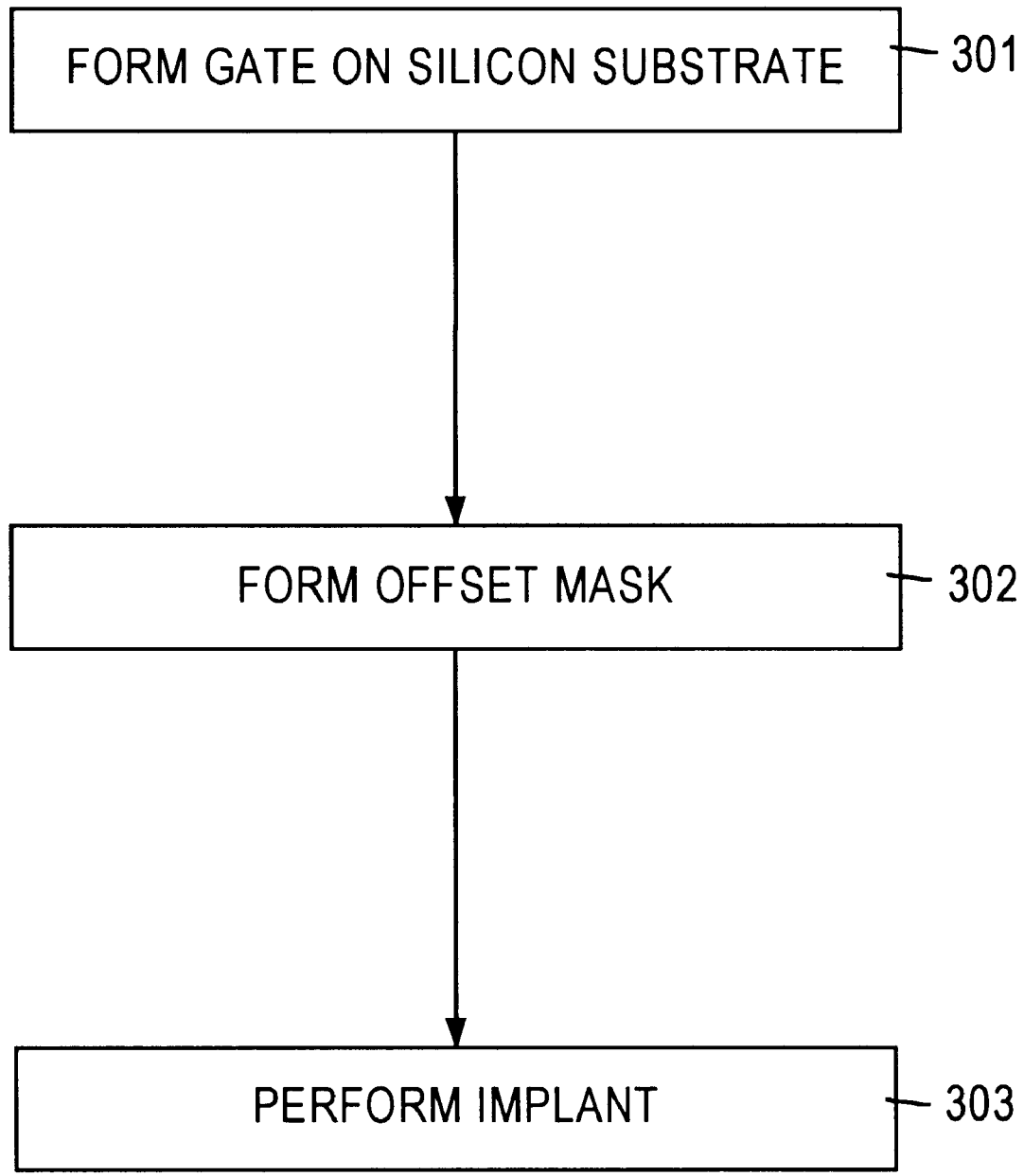
FIG. 3 is a flowchart of a method of asymmetrically doping a region beneath a gate on a substrate according to the first embodiment of the present invention.

FIG. 3 depicts a flowchart of a method of asymmetrically doping a region beneath a gate on a substrate according to the first embodiment of the present invention. The method of asymmetrically doping a region beneath a gate on a substrate according to the present invention is performed on a gate formed on a substrate. Step 301 includes forming a gate using any conventional process, for example, by depositing an oxide layer on the substrate and a polysilicon layer on the gate oxide layer, and performing an anisotropic etching process.

Step 302 includes forming a photoresist mask over the gate Such that the mask extends beyond the opposing sides of the gate in an uneven or offset manner. The mask may be formed using any suitable processing method. The mask is preferably formed to include a first open region spaced a first distance from one side of the gate and a second open region spaced a second distance from an opposing side of the gate. Alternatively, the mask can be formed such that it only includes a single portion positioned above that gate and therefore the mask extends beyond one side by a first distance and an opposing side by a second distance. The present invention contemplates that the first distance and the second distance are predetermined distances that are not equal to one another. Therefore, the present invention contemplates either that the first distance is less than the second distance, or that the first distance is greater than the second distance.

Step 303 includes perfonming an ion implantation of the substrate in accordance with the mask to asymmetrically dope a channel region beneath the gate. The ion implantation proceeds through open regions in the mask to produce well regions in the substrate. The well regions are formed directly beneath their respective open regions and are diffused outward therefrom. The well regions overlap within the channel region beneath the gate, such that there is more dopant on a side of the channel region with the opening region closer to the side of the gate than dopant on an opposing side. By modifying the positioning of the mask above the gate (i.e., the magnitude of the first distance and the second distance), it is possible to define an asymmetric lateral channel profile, which can be advantageously used to vary gate overlap, channel $V_T$, or source/drain doping as necessary.

Figure 4A:
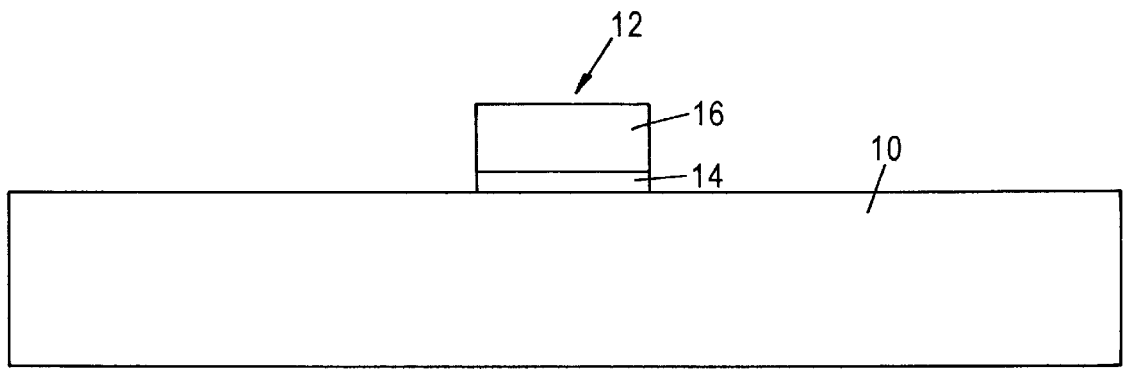
FIG. 4A is a partial, cross-sectional, side view of a semiconductor device according to a second embodiment of the present invention depicting a gate formed on a substrate.

FIGS. 4A–4H depict a semiconductor device of a second embodiment of the present invention at various stages along the manufacturing process. FIG. 4A is a cross-sectional view of a semiconductor device according to a second embodiment of the present invention depicting a gate 12 formed on a semiconductor substrate 10. The substrate 10 is preferably made of silicon. The gate 12 is formed on the substrate 10 and includes a gate oxide layer 14 deposited on a top surface on the substrate 10 and a polysilicon layer 16 deposited on a top surface of the gate oxide layer 12. The sides of the gate oxide layer 14 and the polysilicon layer 16 are then etched using a conventional etching process, for example an anisotropic etching process.

Figure 4B:
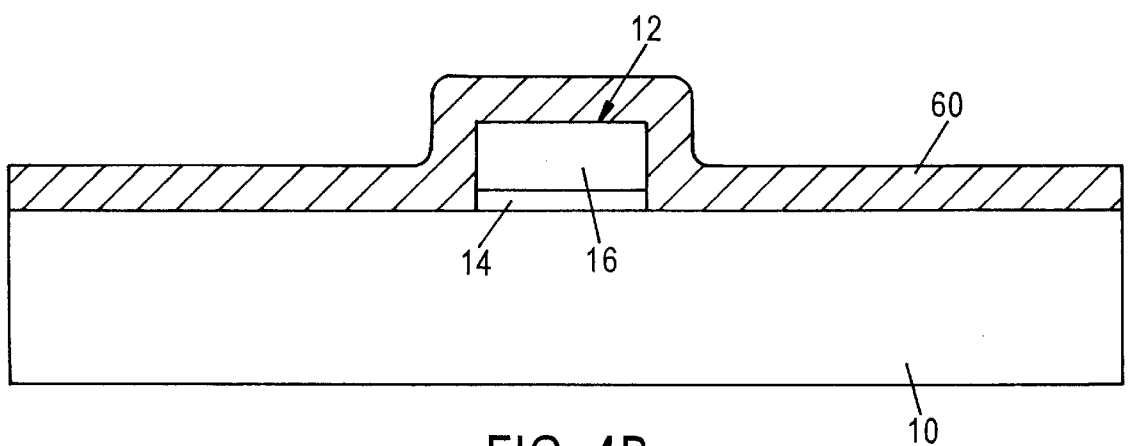
FIG. 4B is a partial, cross-sectional, side view of a semiconductor device according to the second embodiment of the present invention depicting a nitride layer deposited upon the gate and substrate.
Figure 4C:
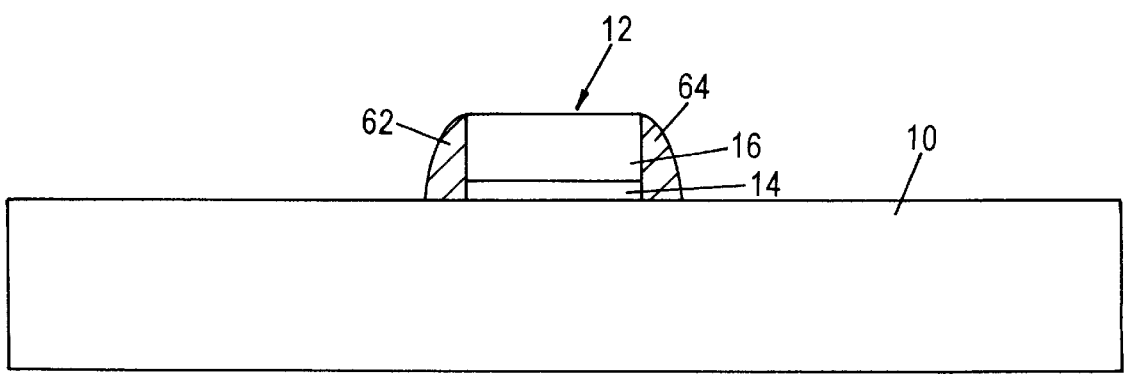
FIG. 4C is a partial, cross-sectional, side view of a semiconductor device according to the second embodiment of the present invention depicting the nitride layer of FIG. 4B etched away to form nitride spacer sidewalls.
Figure 4D:
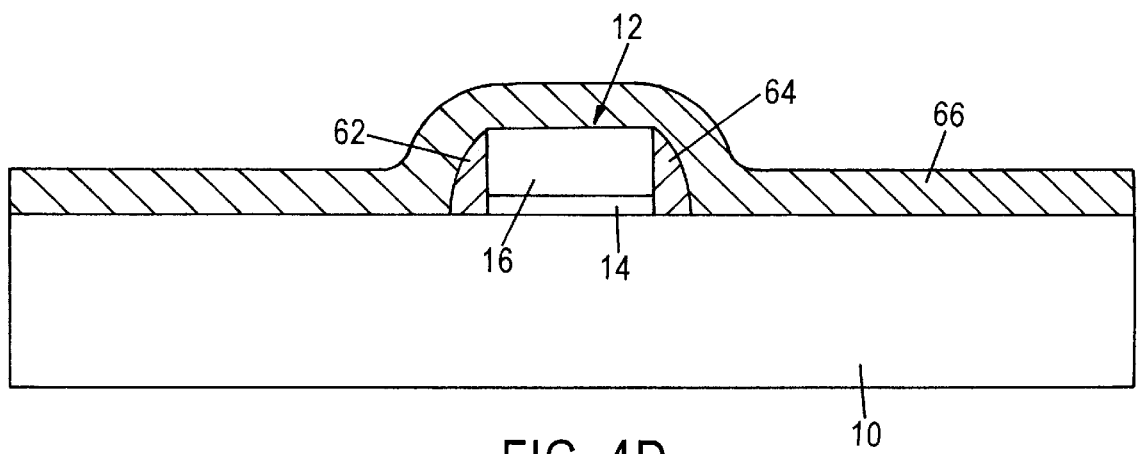
FIG. 4D is a partial, cross-sectional, side view of a semiconductor device according to the second embodiment of the present invention depicting an oxide layer deposited upon the gate, the nitride sidewall spacers, and the substrate.
Figure 4E:
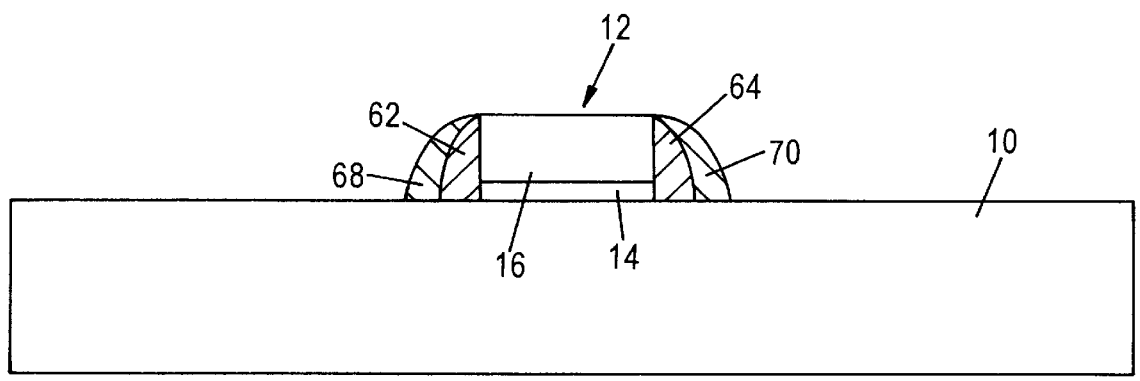
FIG. 4E is a partial, cross-sectional, side view of a semiconductor device according to the second embodiment of the present invention depicting the oxide layer of FIG. 4D etched away to form oxide sidewall spacers adjacent the nitride.

FIG. 4B depicts the substrate 10 and the gate 12 with a layer of material 60, preferably nitride, deposited thereon. The layer 60 is formed using any suitable processing method. As depicted in FIG. 4C, sidewall spacers 62 and 64 are formed on both sides of the gate 12 by etching the layer 60. Any suitable anisotropic etching method can be used to form the sidewall spacers 62 and 64. FIG. 4D depicts the substrate 10, the gate 12 and the sidewall spacers 62 and 64 with a layer of material 66, preferably oxide, deposited thereon. The layer 66 is formed using any suitable processing method. As depicted in FIG. 4E, sidewall spacers 68 and 70 are formed on exposed sides of the sidewall spacers 62 and 64, respectively, by etching the layer 66. Any suitable anisotropic etching method can be used to forn the sidewall spacers 68 and 70.

Figure 4F:
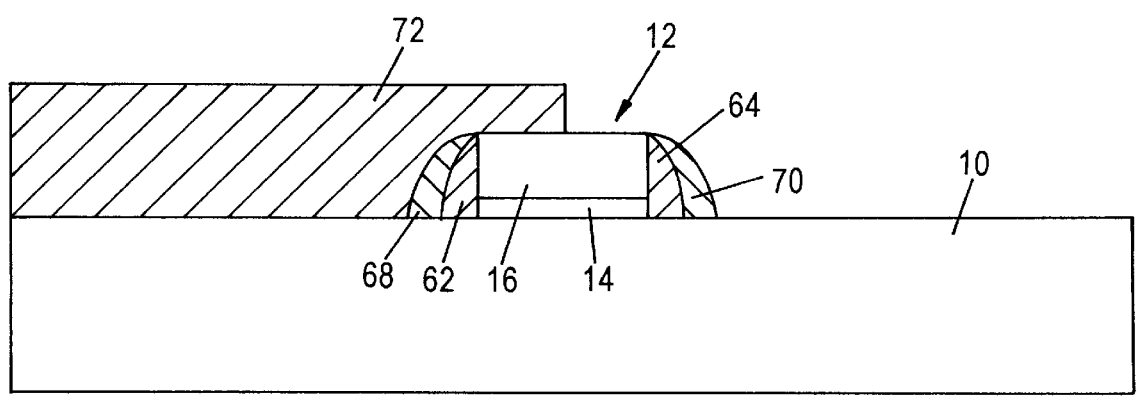
FIG. 4F is a partial, cross-sectional, side view of a semiconductor device according to the second embodiment of the present invention depicting the device of FIG. 4E having half of the gate, one of the nitride sidewall spacers, and one of the oxide sidewall spacers covered by a resist layer.
Figure 4G:
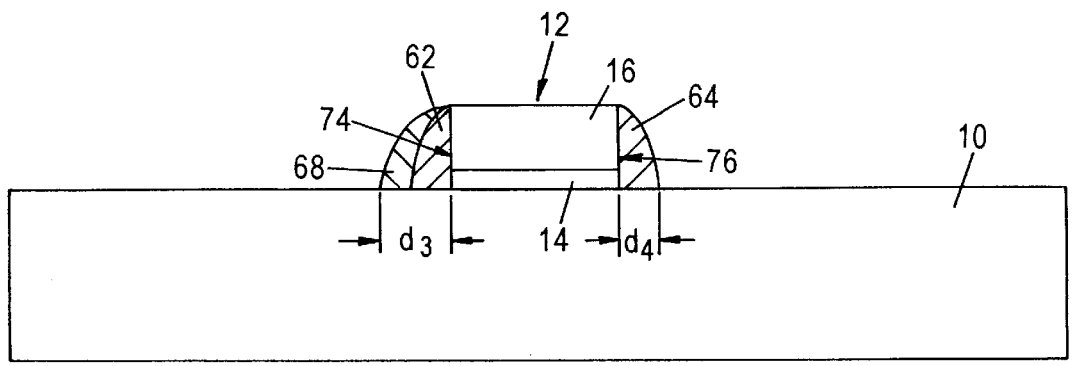
FIG. 4G is a partial, cross-sectional, side view of a semiconductor device according to the second embodiment of the present invention depicting the device of FIG. 4F wherein the exposed oxide sidewall spacer is etched away and the resist layer is removed.

FIG. 4F depicts a mask 72 being positioned on the gate such that sidewall spacer 70 can be etched away. The mask 72 is positioned to cover one of the oxide sidewall spacers 68 and to leave the other oxide sidewall spacer 70 exposed. As depicted in FIG. 4G, an oxide etching process that is selective to nitride is performed to remove the exposed oxide sidewall spacer 70. The mask 72 is removed to reveal the remaining nitride sidewall spacers 62 and 64, and the oxide sidewall spacer 68. Layer 60, and consequently sidewall spacers 62 and 64, is preferably made from nitride and layer 66, and consequently sidewall spacers 68 and 70, is preferably made from oxide. The use of nitride for layer 60 and oxide for layer 66 are exemplary only, and can be modified as needed. Also, nitride may be used in the outer sidewall spacers 68 and 70 and oxide used in the inner sidewall spacers 62 and 64 in certain embodiments. It should be noted that the material used for layer 60 must be resistant to the etching process used to remove sidewall spacer 70, and must be selected accordingly.

In the second embodiment the sidewall spacers 62, 64, and 68 form a mask used during ion implantation. In this exemplary embodiment sidewall spacers 62 and 68 form a mask portion extending a distance $d_4$ from side 74 of the gate 12 and sidewall spacer 64 forms a mask portion extending a distance $d_4$ from side 76 of the gate 12. The present invention contemplates that distance $d_3$ and $d_4$ are predetermined distances that are not equal to one another. For example, the present invention contemplates that distance $d_3$ is more than $d_4$, as depicted in FIG. 4G herein. The mask can be constructed by forming a single wide sidewall spacer (not depicted) in place of sidewall spacers 62 and 68 that extends a distance $d_3$ from side 74 of the gate 12. It will be readily apparent to one skilled in the art that the etching away of one of the sidewall spacers can be performed on sidewall spacer 64 prior to depositing layer 66, rather than etching away sidewall spacer 70. Furthermore, it would be readily apparent to one skilled in the art that the material used for sidewall spacers 62, 64 and spacers 68, 70 could be interchanged for one another to produce a result similar to that described herein.

Figure 4H:
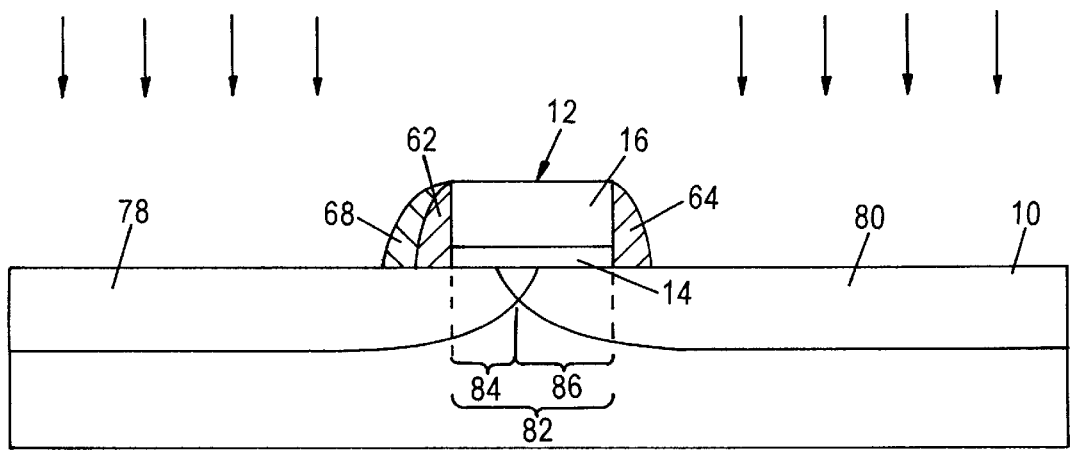
FIG. 4H is a partial, cross-sectional, side view of a semiconductor device according to the second embodiment of the present invention depicting an ion implantation on the substrate in accordance with a mask including the nitride sidewall spacers, and the remaining oxide sidewall spacer to asymmetrically dope a region beneath the gate.

FIG. 4H depicts the semiconductor device according to the second embodiment of the present invention wherein an ion implantation is performed on the substrate 10 in accordance with the sidewall spacers 62, 64, and 68 to asymmetrically dope a region 82 beneath the gate 12. The present invention relies upon lateral diffusion during the implantation of a well to modulate the doping profile of the channel region 82. By modifying the magnitude of $d_3$ and $d_4$, it is possible to define an asymmetric lateral channel profile, which can be advantageously used to vary gate overlap, channel $V_T$, or source/draining doping as necessary. The ion implantation of the semiconductor device in FIG. 4H proceeds through the exposed substrate 10 to produce well regions 78 and 80. The well regions 78 and 80 depicted in FIG. 4H overlap within the channel region 82 beneath the gate 12, such that there is more dopant on a side 86 of the channel region 82, than dopant on an opposing side 84.

Figure 5:
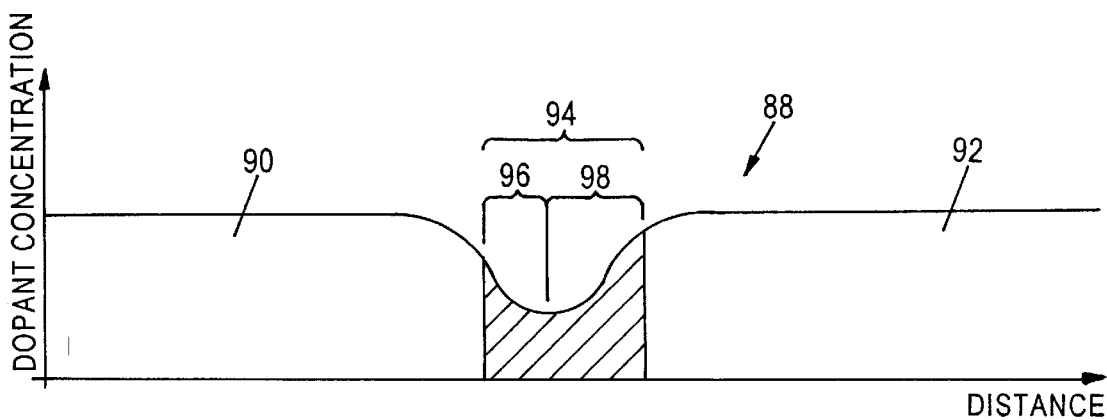
FIG. 5 is a graph depicting an asymmetric doping profile for the semiconductor device according to the second embodiment of the present invention.

FIG. 5 is a graph depicting an asymmetric doping profile 88 for the semiconductor device according to the second embodiment of the present invention. FIG. 5 depicts the doping profile 88 over the length of the semiconductor device depicted in FIG. 4H. Portions 90 and 92 reflect the doping in well regions 78 and 80. In FIG. 5, region 94 corresponds to channel region 82 and regions 96 and 98 correspond to side regions 84 and 86. Note the asymmetric doping profile 88 is larger in region 98 than in region 96. Region 98 is larger because it corresponds to the side 86 of the channel region 82 with the sidewall spacer 64 extending from side 76 of the gate 12 a distance $d_4$, which is less than sidewall spacers 62 and 68 extend from side 74 of the gate 12 (distance $d_3$). By varying $d_3$ and $d_4$, the size of region 96 and region 98 can be varied to produce any necessary doping profile.

Figure 6:
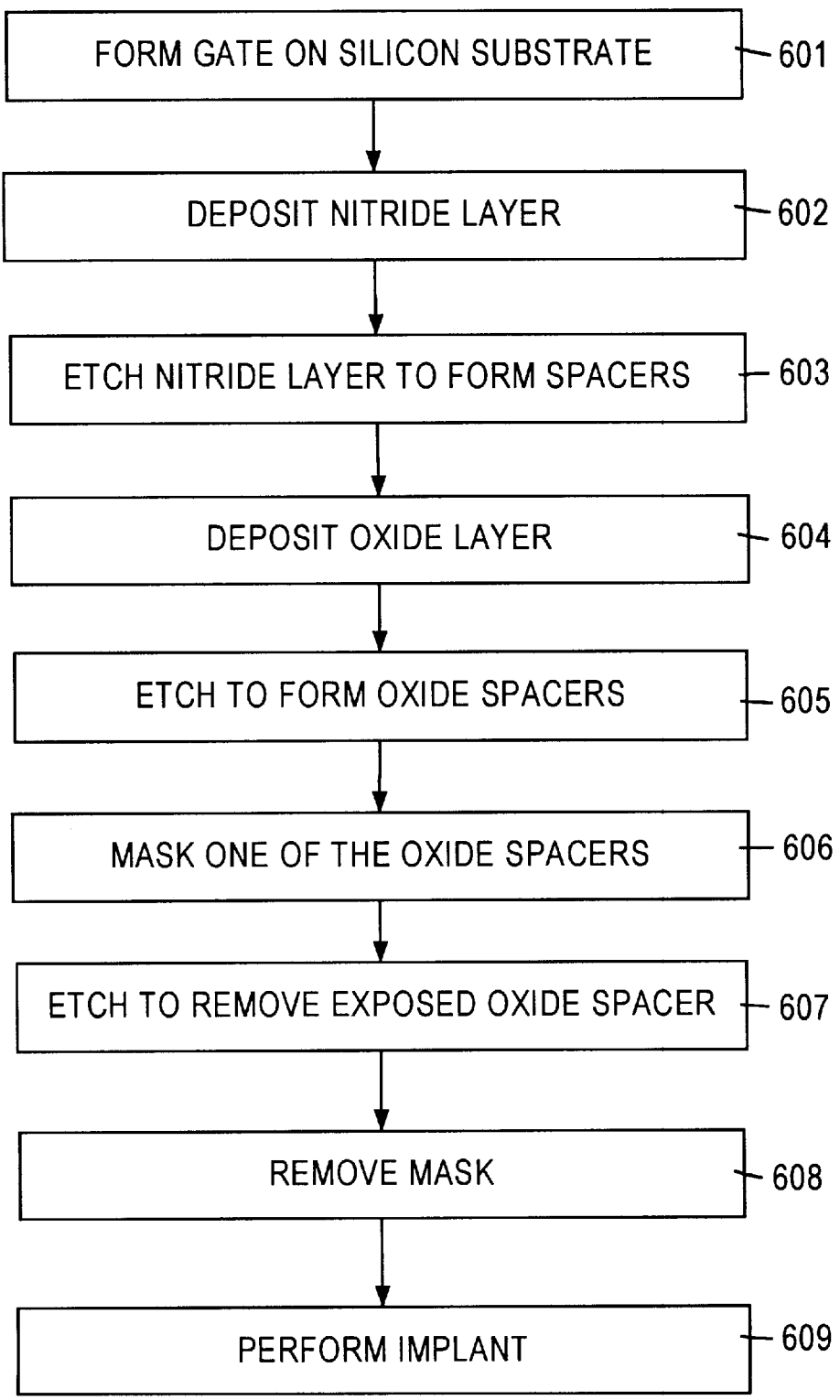
FIG. 6 is a flowchart of a method of asymmetrically doping a region beneath a gate on a substrate according to the second embodiment of the present invention.

FIG. 6 depicts a flowchart of a method of asymmetrically doping a region beneath a gate on a substrate according to the second embodiment of the present invention. The method of asymmetrically doping a region beneath a gate on a substrate according to the present invention is performed on a gate formed on a substrate. Step 601 includes forning a gate using any conventional process, for example, by depositing an oxide layer on the substrate and a polysilicon layer on the gate oxide layer, and performing an anisotropic etching process.

Step 602 includes depositing a layer of material, preferably nitride, on the substrate and the gate, and step 603 includes etching the nitride layer to forn nitride sidewall spacers on both sides of the gate. The nitride layer is preferably etched in an anisotropic manner to form the nitride sidewall spacers, although other suitable processes can be used to form the sidewall spacers. Step 604 includes depositing a layer of material, preferably oxide, on the substrate, the gate, and the nitride sidewall spacers, and step 605 includes etching the oxide layer to form oxide sidewall spacers on the exposed sides of the nitride sidewall spacers. The oxide layer is preferably etched in an anisotropic manner to form the oxide sidewall spacers, although other suitable processes can be used to form the sidewall spacers.

Step 606 includes masking the gate such that one of the oxide sidewall spacers can be etched away. The mask is positioned to cover one of the oxide sidewall spacers and to leave the other oxide sidewall spacer exposed. Step 607 includes performing an oxide etching process to remove the exposed oxide sidewall spacer. Step 608 includes removing the mask to reveal the remaining nitride sidewall spacers and the oxide sidewall spacer. The use of nitride and oxide for the sidewall spacers is exemplary only, and can be modified as needed.

The single remaining oxide sidewall spacer and the two nitride sidewall spacers form a mask on both sides of the gate. The single remaining oxide sidewall spacer and the adjacent nitride sidewall spacer extend a third distance from one side of the gate and the solitary nitride sidewall spacer extends a fourth distance from an opposing side of the gate. The present invention contemplates that third distance and the fourth distance are predetermined distances that are not equal to one another. For example, the present invention contemplates that the third distance is more than the fourth distance.

Step 609 includes performing an ion implantation on the substrate in accordance with the remaining sidewall spacers to dope asymmetrically a channel region beneath the gate. The ion implantation proceeds through the exposed regions in the substrate to produce well regions. The well regions overlap within the channel region beneath the gate, such that there is more dopant on a side of the channel region with the single nitride sidewall spacer than dopant on an opposing side with the oxide sidewall spacer and the nitride sidewall spacer. By modifying the magnitude of the third distance and the fourth distance, it is possible to define an asymmetric lateral channel profile, which can be advantageously used to vary gate overlap, channel $V_T$, or source/drain doping as necessary.

The present invention advantageously provides a method of asymmetrically doping a region beneath a gate. The present invention achieves this result by controlling the lateral surface profile of the gate using a mask that extends beyond the opposing sides of the gate in an. uneven manner. By modifying the positioning of the mask it is possible to define an asymmetric lateral channel profile, which can be advantageously used to vary gate overlap, channel $V_T$, or source/drain doping as necessary.

In the previous descriptions, numerous specific details arc set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method of asymmetrically doping a channel region beneath a gate on a substrate comprising the steps of:
   forming a first pair of sidewall spacers on opposing sides of the gate;
   forming a second pair of sidewall spacers on the first pair of sidewall spacers on opposing sides of the gate;
   removing one of the second sidewall spacers from one side of the gate; and
   implanting dopants in the substrate using the remaining sidewalls spacers as a mask to form two overlapping well regions in the substrate extending beneath the gate and within the channel region, wherein the channel region beneath the gate having one sidewall spacer contains more dopant than the channel region beneath the gate having two side wall spacers.

2. The method according to claim 1, wherein the step of forming a first pair of sidewall spacers comprises the steps of:
   depositing a layer of nitride upon the gate and substrate; and
   anisotropically etching the nitride layer to form the first pair of sidewall spacers.

3. The method according to claim 2, wherein the step of forming a second pair of sidewall spacers comprises the steps of:
   depositing a layer of oxide upon the substrate, gate, and the nitride spacers; and
   anisotropically etching the oxide layer to form the second pair of sidewall spacers.

4. The method according to claim 3, wherein the step of removing one of the second sidewall spacers comprises the steps of:
   positioning a mask to cover the spacers on one side of the gate while exposing the spacers on the opposing side of the gate; and
   etching the exposed oxide spacer.

5. The method according to claim 4, further comprising removing the mask covering the sidewall spacers.

6. The method according to claim 1, wherein the step of forming a first pair of sidewall spacers comprise the steps of:
   depositing a layer of oxide upon the gate and substrate; and
   anisotropically etching the oxide layer to form the first pair of sidewall spacers.

7. The method according to claim 6, wherein the step of forming the second pair of sidewall spacers comprises the steps of:
   depositing a layer of nitride upon the substrate, gate, and oxide spacers; and
   anisotropically etching the nitride layer to form the second pair of sidewall spacers.

8. The method according to claim 7, wherein the step of removing one of the second sidewall spacers comprises the steps of:
   positioning a mask to cover the spacers on one side of the gate while exposing the spacers on the opposing side of the gate; and
   etching the exposed nitride spacers.

9. The method according to claim 8, further comprising removing the mask covering the sidewall spacers.

10. A method of asymmetrically doping channel region beneath a gate on a substrate comprising the steps of:
    forming a first pair of sidewall spacers on opposing sides of the gate;
    removing one of the first sidewall spacers from one side of the gate;
    forming a second pair of sidewall spacers on opposing sides of the gate and the remaining first sidewall spacer; and
    implanting dopants in the substrate using the remaining first sidewall spacer and second sidewall spacers as a mask to form two overlapping well regions in the substrate extending beneath the gate and within the channel region, wherein the channel region beneath the gate having one sidewall spacer contains more dopant than the channel region beneath the gate having two sidewall spacers.

11. The method according to claim 10, wherein the step of forming a first pair of sidewall spacers comprises the steps of:
    depositing a layer of nitride upon the gate and substrate; and
    anisotropically etching the nitride layer to form the first pair of sidewall spacers.

12. The method according to claim 11, wherein the step of removing one of the first sidewall spacers comprises the steps of:
    positioning a mask to cover one of the nitride spacers while exposing the spacer on the opposing side of the gate; and
    etching the exposed nitride spacer.

13. The method according to claim 12, further comprising removing the mask covering the nitride spacer.

14. The method according to claim 13, wherein the step of forming a second pair of sidewall spacers comprises the steps of:
    depositing a layer of oxide upon the substrate, gate, and the remaining nitride sidewall spacer; and
    anisotropically etching the oxide layer to form the second pair of sidewall spacers.

15. The method according to claim 10, wherein the step of forming a first pair of sidewall spacers comprises the steps of:
    depositing a layer of oxide upon the gate and substrate; and
    anisotropically etching the oxide layer to form the first pair of sidewall spacers.

16. The method according to claim 15, wherein the step of removing one of the first sidewall spacers comprises the steps of:
    positioning a mask to cover one of the oxide spacers while exposing the spacer on the opposing side of the gate; and
    etching the exposed oxide spacer.

17. The method according to claim 16, further comprising removing the mask covering the oxide spacer.

18. The method according to claim 17, wherein the step of forming a second pair of sidewall spacers comprises the steps of:
    depositing a layer of nitride upon the gate and the remaining oxide sidewall spacer; and
    anisotropically etching the nitride layer to form the second pair of sidewall spacers.

* * * * *